(12) United States Patent
Costaganna et al.

(10) Patent No.: US 10,181,429 B2
(45) Date of Patent: Jan. 15, 2019

(54) METHOD FOR THE FORMATION OF TRANSISTORS PDSO1 AND FDSO1 ON A SAME SUBSTRATE

(71) Applicant: X-FAB Semiconductor Foundries AG, Erfurt (DE)

(72) Inventors: Pascal Costaganna, Chailly en Biere (FR); Francis Domart, Mennecy (FR); Gregory U'Ren, Chevreuse (FR)

(73) Assignee: X-FAB Semiconductor Foundries AG, Erfurt (DE)

( * ) Notice: Subject to any disclaimer, the term of this patent is extended or adjusted under 35 U.S.C. 154(b) by 0 days.

(21) Appl. No.: 15/602,362

(22) Filed: May 23, 2017

(65) Prior Publication Data

US 2017/0345724 A1    Nov. 30, 2017

(30) Foreign Application Priority Data

May 24, 2016   (FR) ...................... 16 54651

(51) Int. Cl.
| | |
|---|---|
| *H01L 21/76* | (2006.01) |
| *H01L 29/78* | (2006.01) |
| *H01L 21/84* | (2006.01) |
| *H01L 27/12* | (2006.01) |
| *H01L 21/02* | (2006.01) |
| *H01L 21/3065* | (2006.01) |
| *H01L 21/308* | (2006.01) |
| *H01L 21/762* | (2006.01) |
| *H01L 29/06* | (2006.01) |

(52) U.S. Cl.
CPC ........ *H01L 21/84* (2013.01); *H01L 21/02057* (2013.01); *H01L 21/02236* (2013.01); *H01L 21/308* (2013.01); *H01L 21/3065* (2013.01); *H01L 21/76264* (2013.01); *H01L 27/1203* (2013.01); *H01L 27/1207* (2013.01); *H01L 29/0649* (2013.01); *H01L 29/7838* (2013.01)

(58) Field of Classification Search
CPC . H01L 21/76264; H01L 21/84; H01L 27/085; H01L 27/1203; H01L 27/1207; H01L 29/7838
See application file for complete search history.

(56) References Cited

U.S. PATENT DOCUMENTS

| | | |
|---|---|---|
| 5,369,544 A | 11/1994 | Mastrangelo |
| 5,489,792 A | 2/1996 | Hu et al. |
| 5,637,899 A | 6/1997 | Eimori et al. |
| 5,843,822 A | 12/1998 | Hsia et al. |
| 5,909,621 A | 6/1999 | Hsia et al. |
| 5,940,691 A | 8/1999 | Manning |

(Continued)

FOREIGN PATENT DOCUMENTS

WO         03/054966        7/2003

*Primary Examiner* — Yu Chen
*Assistant Examiner* — Christopher M Roland
(74) *Attorney, Agent, or Firm* — Hauptman Ham, LLP

(57) ABSTRACT

The present invention relates to a method for forming an electronic device intended to accommodate at least one fully depleted transistor of the FDSOI type and at least one partially depleted transistor of the PDSOI type, from a stack of layers (10) comprising at least one insulating layer (100) topped with at least one active layer (200) made of a semiconductor material, the method comprising at least one step of dry etching and one step of height adjustment between at least two etched elements.

17 Claims, 5 Drawing Sheets

(56) References Cited

U.S. PATENT DOCUMENTS

| | | |
|---|---|---|
| 5,960,317 A | 9/1999 | Jeong |
| 5,962,895 A | 10/1999 | Beyer et al. |
| 5,965,462 A | 10/1999 | Tan et al. |
| 6,048,775 A | 4/2000 | Yao et al. |
| 6,174,755 B1 | 1/2001 | Manning |
| 6,177,708 B1 | 1/2001 | Kuang et al. |
| 6,222,234 B1 * | 4/2001 | Imai ............ H01L 21/84 257/347 |
| 6,232,170 B1 | 5/2001 | Hakey et al. |
| 6,232,218 B1 | 5/2001 | Cathey et al. |
| 6,238,999 B1 | 5/2001 | Dickerson et al. |
| 6,251,746 B1 | 6/2001 | Hong et al. |
| 6,274,501 B1 | 8/2001 | Riccobene et al. |
| 6,277,680 B1 | 8/2001 | Manning |
| 6,281,056 B2 | 8/2001 | Manning |
| 6,316,281 B1 | 11/2001 | Lee et al. |
| 6,326,247 B1 | 12/2001 | Krishnan et al. |
| 6,329,267 B1 | 12/2001 | Dickerson et al. |
| 6,329,689 B1 | 12/2001 | Manning |
| 6,331,469 B1 | 12/2001 | Park et al. |
| 6,372,601 B1 | 4/2002 | Dickerson et al. |
| 6,372,655 B2 | 4/2002 | Khan et al. |
| 6,376,303 B1 | 4/2002 | Seo et al. |
| 6,391,788 B1 | 5/2002 | Khan et al. |
| 6,406,977 B2 | 6/2002 | Dickerson et al. |
| 6,414,355 B1 | 7/2002 | An et al. |
| 6,417,073 B2 | 7/2002 | Watanabe |
| 6,448,114 B1 | 9/2002 | An et al. |
| 6,465,866 B2 | 10/2002 | Park et al. |
| 6,518,192 B2 | 2/2003 | Khan et al. |
| 6,537,891 B1 | 3/2003 | Dennison et al. |
| 6,558,994 B2 | 5/2003 | Cha et al. |
| 6,593,206 B2 | 7/2003 | Dickerson et al. |
| 6,599,813 B2 | 7/2003 | Beyer et al. |
| 6,602,720 B2 | 8/2003 | Hsu et al. |
| 6,710,420 B2 | 3/2004 | Dickerson et al. |
| 6,764,917 B1 * | 7/2004 | Chan ............ H01L 21/84 257/E21.703 |
| 6,774,016 B2 | 8/2004 | Jang |
| 6,818,496 B2 | 11/2004 | Dennison et al. |
| 6,916,744 B2 | 7/2005 | Achutharaman et al. |
| 6,967,146 B2 | 11/2005 | Dickerson et al. |
| 6,999,650 B2 | 2/2006 | Kato |
| 7,198,993 B2 | 4/2007 | Tigelaar et al. |
| 7,235,458 B2 | 6/2007 | Yang |
| 7,410,840 B2 | 8/2008 | Tigelaar |
| 7,410,841 B2 | 8/2008 | Tigelaar |
| 7,476,561 B2 | 1/2009 | Mori et al. |
| 7,510,927 B2 | 3/2009 | Bohr et al. |
| 7,736,998 B2 | 6/2010 | Morita et al. |
| 7,847,353 B2 | 12/2010 | Hill et al. |
| 7,927,979 B2 | 4/2011 | Hill et al. |
| 7,973,373 B2 | 7/2011 | Mori et al. |
| 8,043,882 B2 | 10/2011 | Mori et al. |
| 8,241,923 B2 | 8/2012 | Morii |
| 8,624,354 B2 | 1/2014 | Kim et al. |
| 9,041,105 B2 | 5/2015 | Clark, Jr. et al. |
| 9,165,776 B2 | 10/2015 | Umezaki et al. |
| 2002/0072225 A1 | 6/2002 | Laaksonen et al. |
| 2003/0003678 A1 | 1/2003 | Beyer et al. |
| 2003/0094660 A1 | 5/2003 | Crowder et al. |
| 2004/0124490 A1 * | 7/2004 | Bohr ............ H01L 21/76264 257/506 |
| 2005/0006704 A1 * | 1/2005 | Ning ............ H01L 21/84 257/350 |
| 2006/0054972 A1 | 3/2006 | Kronmueller |
| 2006/0216898 A1 | 9/2006 | Tigelaar |
| 2008/0169508 A1 | 7/2008 | Chidambarrao et al. |
| 2010/0013060 A1 * | 1/2010 | Lamy ............ H01L 21/76898 257/621 |
| 2010/0109084 A1 | 5/2010 | Chung |
| 2013/0214384 A1 | 8/2013 | Botula et al. |
| 2014/0179082 A1 | 6/2014 | Foster et al. |

\* cited by examiner

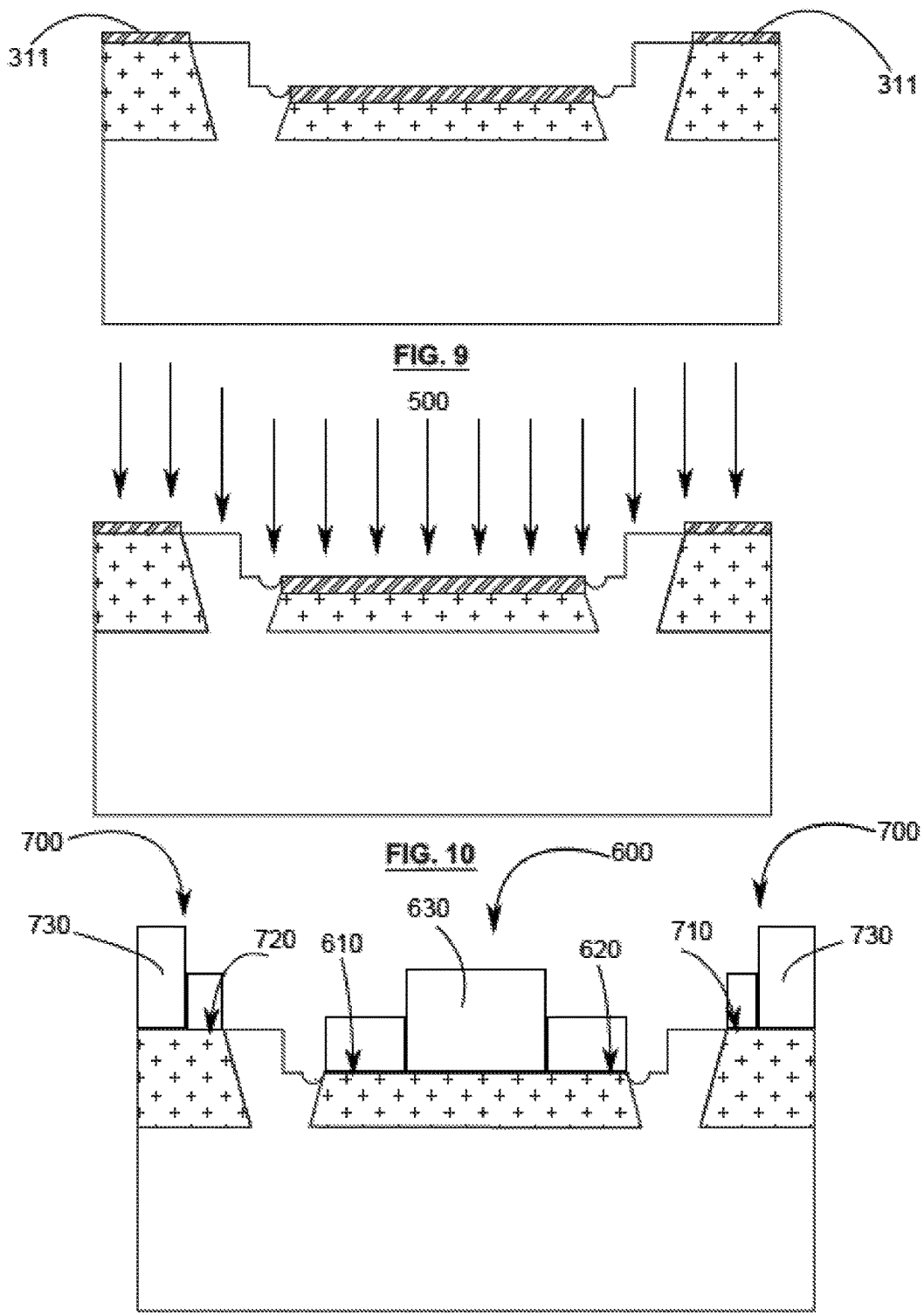

METHOD FOR THE FORMATION OF TRANSISTORS PDSO1 AND FDSO1 ON A SAME SUBSTRATE

TECHNICAL FIELD OF THE INVENTION

The present invention relates to the field of micro-electronics and more particularly the field of partially depleted transistors and fully depleted transistors mounted on the same semiconductor wafer.

PRIOR ART

In the field of integrated circuits formed from elaborate substrates of the semiconductor-on-insulator type, also referred to by their acronym SOI for « Semiconductor On Insulator », two types of transistors are generally used: partially depleted transistors, also referred to by their acronym PDSOI, for « Partially Depleted Semiconductor On Insulator », and fully depleted transistors, also referred to by their acronym FDSOI, for « Fully Depleted Semiconductor On Insulator ».

An elaborate substrate is characterised by the presence of a thin surface layer of single-crystal semiconductor, like single-crystal silicon, for instance, supported by a continuous insulating oxide layer, for instance silicon oxide, also called buried oxide, or BOX, the acronym for « Buried Oxide Layer ». The solidity and mechanical strength of the assembly are provided by a layer supporting the BOX and which is the body of the SOI substrate, often called « bulk » to indicate that the original substrate is generally made of a solid semiconductor material, silicon, for instance, Such structure has many advantages for making MOS transistors, the acronym for « Metal-Oxide-semiconductor ». More particularly, it enables a drastic reduction of stray capacities because of the presence of the continuous insulating layer.

Both FDSOI and PDSOI transistor types meet specific needs in the field of analog and digital electronics, and specifically in the field of radio-frequency electronics.

Electronic devices comprising FDSOI transistors and PDSOI transistors on the same electronic chips are also known from the prior art.

The prior art provides several solutions for forming such type of electronic devices. However some solutions are relatively complex and expensive to be implemented for reproducibly obtaining, on the same chip, high-performance transistors. A need thus exists for a simpler production and reduced production costs for such electronic devices.

SUMMARY OF THE INVENTION

The present invention relates to a method for forming an electronic device intended to accommodate at least one fully depleted transistor (FDSOI) and at least one partially depleted transistor (PDSOI), from a stack of layers comprising at least one insulating layer topped with at least one active layer made of a semiconductor material, with the method comprising at least the following steps:

Forming at least one shallow trench through the thickness of the active layer so as to define, in said active layer, on either side of the shallow trench, at least one first active region whereon at least one partially depleted transistor (PDSOI) is intended to be formed and at least one second active region whereon at least one fully depleted transistor (FDSOI) is intended to be formed;

Forming, above the at least one first active region and on a part of the shallow trench, a masking layer, without covering the at least one second active region and without covering a part of the shallow trench;

Simultaneously etching, using dry etching, so as to form etched areas:

a portion of the thickness of the active layer of the at least one second active region so as to form at least one second thinned active region and to obtain, in the at least one second thinned active region, a smaller thickness of the active layer than in the at least one first active region;

at least a part of the thickness of the not covered part of the shallow trench so as to form an etched part of the shallow trench, and the whole masking layer;

Adjusting, after the step of dry etching, the height of the surface of the at least one second thinned active region to the height of the surface of said one etched part of the shallow trench.

The present invention makes it possible to form, on the same semiconductor substrate, preferably of the SOI type, a plurality of partially depleted transistors of the PDSOI type and fully depleted transistors of the FDSOI type in a minimum number of steps, i.e. by implementing economical steps in terms of process time savings and as regards the chemistry currently used in the prior art. As a matter of fact, the present invention takes advantage of a synergy of these steps in order to optimize the utility of each one of these, while minimising the number thereof.

Such synergy relies on two steps, i.e. a step of dry etching and a step of forming a sacrificial oxide layer: dry etching makes it possible to simultaneously etch a plurality of different layers and of materials and the sacrificial oxide layer makes it possible to improve the performances of the FDSOI transistor while facilitating the formation of the source and drain areas caused by a screening effect during the subsequent steps of ion implantation.

Dry etching is a step making it possible to quickly and easily thinning one region of the active layer while thinning a portion of the shallow trenches surrounding said thinned region of the active layer.

Advantageously, such step of dry etching makes it possible to remove the masking layer, also called hard mask, of the PDSOI areas as well as to thin one region of the active layer and one portion of the shallow trenches. In order to be able to simultaneously etch three materials having a different nature, so that the desired thinned thickness corresponds to the complete etching of one of the three materials, preferably the masking layer selecting the nature and the structure thereof is a critical point, as is the selection of the dry etching.

Advantageously, one oxide, preferably silicon oxide, obtained by low pressure chemical vapor deposition, also called a LPCVD oxide, i.e. the acronym for « Low-Pressure Chemical Vapor Deposition » and one oxide, preferably silicon oxide, obtained by chemical vapor deposition executed at a sub-atmospheric pressure, also called a PECVD oxide, i.e. the acronym for « Plasma-enhanced Chemical Vapor Deposition » have cleverly been so selected as to meet such requirement. The PECVD oxide forms the insulating trenches whereas the LPCVD oxide forms the masking layer. Thus, one single step of etching thus makes it possible to etch three different materials under the desired thinning and removing conditions.

However, such step of dry etching leads to the forming of micro-trenches at the junction between the thinned region of the active layer and the etched parts of the shallow trenches. Such micro-trenches directly result from the nature of the dry etching at the interface between two different materials and cause the subsequent forming of rails made of polycrystalline material in the subsequent steps of the formation of the FDSOI transistors. Such phenomenon called «Microtrenching», is well known to the persons skilled in the art and would have dissuaded these persons to use dry etching to thin the active layer as well as a part of the shallow trenches.

As a matter of fact, it may seem that such micro-trenches suggest that the performances of the FDSOI transistors will be affected. However, when developing the present invention, the effects of such micro-trenches on the transistors performances could be controlled. Surprisingly, the step of adjusting the height of the surface of the at least one second thinned active region to the height of the surface of said etched part of the shallow trench makes it possible to control the structure of such micro-trenches, so that these do not affect the performances of the FDSOI transistors.

As regards the use of a sacrificial oxide layer, it provides at least three distinct functions in synergy with the issue of reducing the production costs and with the preceding step of dry etching.

As a matter of fact, such sacrificial oxide layer makes it possible, on the one hand, to improve the surface condition of the thinned active layer by eliminating the surface defects from the thinned region of the active layer induced by the dry etching, and on the other hand, to adjust the height of such thinned region of the active layer to the height of the surface of the etched part of the insulating trench, so as to eliminate the nuisance of the micro-trenches and optimise the performances of the FDSOI transistor, while preserving easily executable steps to obtain such transistor.

The present invention also relates to an electronic device intended to accommodate at least one fully depleted transistor of the FDSOI type and at least one partially depleted transistor of the PDSOI type, produced with the method according to the present invention.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIG. 9 shows, according to one embodiment of the present invention, a step of removing a nitride layer.

FIG. 10 shows, according to one embodiment of the present invention; a step of ion implantation for forming source and drain areas.

FIG. 11 shows, according to one embodiment of the present invention, a FDSOI transistor and two PDSOI transistors formed according to an exemplary embodiment of the present invention.

Figure 1:
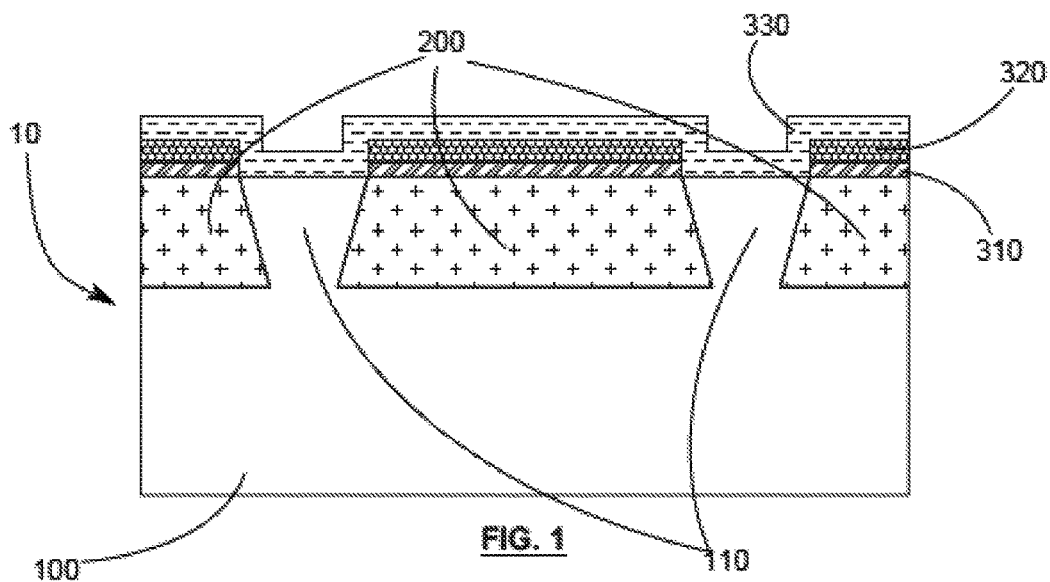
FIG. 1 shows, according to one embodiment of the present invention; a substrate of the SOI type advantageously comprising a plurality of layers placed at the surface of a SOI structure, among which a masking layer. The present invention can preferably be implemented from such type of layer stacks.

The drawings attached are given as examples and are not limiting to the invention. Such drawings are schematic representations and are not necessarily to scale with a practical application. Particularly, the relative thickness of the various layers and substrates are not a representation of reality.

DETAILED DESCRIPTION OF THE INVENTION

PDSOI transistor or more generally PDSOI device mean a device produced in an area, the thickness of which is greater than the maximum depletion layer $W_{d\_max}$.

FDSOI transistor or more generally FDSOI device mean, a device produced in an area, the thickness of which is smaller than the maximum depletion layer $W_{d\_max}$.

The thickness of such maximum depletion layer $W_{d\_max}$ is given by the equation:

$$W_{d\_max}=(2\varepsilon_{si}\varepsilon_0 2\varphi_F/qN_A)^{1/2}$$

where:
$\varepsilon_s$: relative dielectric constant of silicon;
$\varepsilon_0$: capacitivity of free space;
$\varphi_F=(kT/q) \ln(N_A/n_i)-$;
k: Boltzmann constant;
T: temperature;
$n_i$: silicon carrier intrinsic concentration;
q: elementary electric charge;
$N_A$: concentration of impurities.
Everything at ambient temperature (300K) gives $\varphi_F=0.0259 \ln(N_A/1.5\times10^{10})$
In the following description, «PDSOI area»
  means an area of the substrate intended to receive at least one PDSOI transistor and comprising an active layer and a part of the shallow trenches located on either side of the considered active layer.
«FDSOI area» means an area of the substrate intended to receive at least one FDSOI transistor and comprising an active layer and a part of the shallow trenches located on either side of the considered active layer.
«PDSOI active region» means one region of the substrate comprising an active layer intended for forming at least one PDSOI transistor.
«FDSOI active region» means one region of the substrate comprising an active layer intended for forming at least one FDSOI transistor.
«PECVD oxide» means one oxide formed by plasma-enhanced chemical vapor deposition.
«LPCVD oxide» means one oxide formed by sub-atmospheric chemical vapor phase deposition.

It should be noted that, within the scope of the present invention: «wafer», «substrate» or «chip» or the equivalents thereof refer to one device advantageously comprising one or more semiconductor layer(s) and so configured as to receive the formation of semiconductor structures like transistors for instance.

It should be noted that, within the scope of the present invention: «SOI Substrate», or the equivalents thereof refer to a substrate characterised by the presence of a single-crystal semiconductor surface layer, like single-crystal silicon, for instance, supported by a continuous insulating oxide layer, for instance silicon oxide, also called buried oxide, or BOX, the acronym for «buried oxide layer». The solidity and mechanical strength of the assembly are provided by a supporting layer, for instance made of silicon.

It should be specified that, within the scope of the present invention, «over», «on the top of» or «underlying» or the equivalents thereof do not necessarily mean «in contact with». Then, for instance, depositing a first layer on a second layer, does not necessarily mean that both layers are in direct contact with one another, but means that the first layer at least partially covers the second layer and is either in direct contact therewith, or spaced therefrom by another layer or another element.

In the following description, thickness is generally measured in directions perpendicular to the plane of the lower face of the layer to be etched or of a substrate whereon the lower layer has been deposited. Thus, thickness is thus generally measured along a vertical direction in the figures shown.

In the following description, the «same height» or the equivalents thereof, mean that two different surfaces are located in the same plane, parallel to the substrate, i.e. relative to the figures of the not restrictive example, that two different surfaces are located in the same horizontal plane.

In the following description, «levelling», «height adjusting» or the equivalents thereof, mean modifying the height of a layer so that the surface thereof is located in the same plane as the surface of another layer, typically in the same horizontal plane relative to the figures in the not restrictive example.

Within the scope of the present invention, an organic or organo-mineral material which can be formed mechanically or by being exposed to an electron beam, a photon beam or an X-ray beam, is called a resin.

In the following description, «etching» means the partial or total removal of a given material.

In the following description, «wet etching» means an etching technique which requires using wet chemistry, i.e. baths, generally.

In the following description, «dry etching» means an etching technique in a non wet medium, and preferably using plasma.

«Compliant» means layer geometry having, within production tolerances, a constant thickness, in spite of the changes in the direction of layers, for instance on vertical sides of some structures.

«Step» does not necessarily means that the actions executed during one step are simultaneous or immediately successive. Some actions of one first step can be followed by actions of a different step, and other actions of the first step can be resumed afterwards. Thus, "steps" does not necessary mean unit actions which can be separated in time and in the sequence of the process phases.

«Structure» of a material, means the distribution in space of the elementary components thereof, as regards crystallography. Two layers of the same material can thus have the same nature but different crystal structures.

«Nature» of a material, means the chemical composition and/or the crystal structure thereof. Two layers can thus have the same chemical composition but a different nature as regards crystallography.

Prior to giving a detailed description of the various embodiments of the invention, optional characteristics which may be used in association or alternately with the above characteristics are enumerated hereunder:

Advantageously, the shallow trench 110 comprises at least one oxide formed by plasma-enhanced chemical vapor deposition, which is called a PECVD oxide in the following description.

Advantageously, the masking layer 330 comprises at least one oxide formed by sub-atmospheric chemical vapor phase deposition, which is called a LPCVD oxide in the following description.

Advantageously, the PECVD oxide is a silicon oxide.

Advantageously, the LPCVD oxide is a silicon oxide

The conditions selected for the deposition and the nature of the PECVD and LPCVD oxides determine the respective etching rates thereof during the step of dry etching 400. According to one embodiment of the present invention; the conditions for forming and etching these two oxides are so configured that the total etching time of the LPCVD oxide corresponds to the etching of the desired thickness of the PECVD oxide.

Advantageously, the dry etching 400, the oxide 110 formed by plasma-enhanced chemical vapor deposition and the oxide 330 formed by sub-atmospheric chemical vapor phase deposition are configured, specifically the thickness of such oxides and/or the etching selectivity thereof, so that the time required for forming the at least one etched portion of the shallow trench 112 corresponds to the time required for etching the whole thickness of the masking layer 330.

Advantageously, the step of adjusting the height of the surface 221a of the at least one second thinned active region 220a to the height of the surface 113 of said etched part of the shallow trench 112 comprises at least the following steps:

oxidation of at least one portion of the second thinned active region 220a so as to form a sacrificial oxide layer 225;

at least partial removal of the sacrificial oxide layer 225 so as to form a residual sacrificial oxide layer 230 and so that the surface 231 of the residual sacrificial oxide layer 230 is at the same height as the surface 113 of the not covered part of the etched shallow trench 112.

Advantageously, the sacrificial oxide layer 225 is formed by a step of oxidation on at least a part of the thickness of the at least one second thinned active region 220a.

According to one embodiment, the sacrificial oxide layer 225 has a thickness preferably ranging from 2 nm to 20 nm, advantageously from 5 nm to 15 nm, and preferably equal to 7.5 nm, Advantageously, the sacrificial oxide layer 225 has a thickness preferably ranging from 6 nm to 8 nm, and advantageously equal to 5 nm, Advantageously, the residual sacrificial oxide layer 230 has a thickness preferably ranging from 0 nm to 10 nm, advantageously from 2 nm to 7 nm, and preferably equal to 5 nm, Advantageously, the dry etching 400 is a plasma etching.

Advantageously, said plasma is a high density plasma.

Advantageously, the parameters for the plasma dry etching are:
1$^{st}$ phase (also called breakthrough phase)
  Source power TCP 500 W;
  Pressure: 4 mT;
  Helium pressure (He) at the wafer backside (He Cooling) 8T;
  CF4 50 sccm (Standard Cubic Centimeter per Minute), as measured under standard temperature and pressure conditions;
  Bias 50 W;
2$^{nd}$ phase (also called silicon etching)
  Source power TCP 600 W;
  Pressure: 25 mT;
  Helium pressure at the wafer backside (He Cooling) 8T;
  C12 125 sccm O2 19 sccm;
  Bias 400 W;
3$^{rd}$ phase (also called final cleaning)
  Source power TCP 1200 W;
  Pressure: 10 mT;
  Helium pressure at the wafer backside (He Cooling) 8T;
  Argon (Ar) 120 sccm/O2 12 sccm/CF4 60 sccm;
  Bias 0 W.

Advantageously, the active region 200 has an initial thickness preferably ranging from 100 nm to 200 nm, advantageously from 125 nm to 180 nm, and preferably equal to 140 nm, Advantageously, the first active region 210 has a thickness preferably ranging from 100 nm to 200 nm, advantageously from 125 nm to 180 nm, and preferably equal to 140 nm, Advantageously, the at least one second thinned active region 220a has a thickness preferably ranging from 25 nm to 100 nm, advantageously from 50 nm to 85 nm, and preferably equal to 70 nm, Advantageously, the step of dry etching 400 is followed by a step of wet cleaning the surfaces of said etched areas.

Advantageously, the step of wet cleaning the surface of said etched areas is so configured as to eliminate residual materials resulting from the step of dry etching 400.

Advantageously, the residual materials are oxides of the semiconductor material.

Advantageously, the shallow trench 110 contacts the insulating layer 100.

Advantageously, the step of forming the masking layer 330 above the at least one first active region 210 and on at least a part of the shallow trench 110 follows the forming of an intermediate oxide layer 310 on said first active region 210.

Advantageously, the step of forming the intermediate oxide layer 310 on the first active region 210 is followed by the forming of a nitride layer 320 above the intermediate oxide layer 310, so that the masking layer 330 at least partially contacts said nitride layer 320.

According to one embodiment, the insulating layer 100 has a thickness ranging from 50 nm to 1,000 nm, advantageously from 200 nm to 600 nm and preferably equal to 400 nm.

Advantageously, the intermediate oxide layer 310 has a thickness ranging from 1 nm to 10 nm, preferably from 2 nm to 7 nm, and preferably equal to 5 nm, Advantageously, the nitride layer 320 has a thickness ranging from 10 nm to 150 nm, and preferably ranging from 50 nm to 100 nm, and preferably equal to 70 nm, According to one embodiment, the thickness of the STIs 110 ranges from 100 nm to 200 nm, advantageously from 125 nm to 180 nm, and preferably equal to 140 nm, Advantageously, the thickness of the masking layer 330 ranges from 20 nm to 100 nm, preferably from 35 nm to 65 nm, and advantageously equal to 42.5 nm, Advantageously, the conditions for forming such PECVD oxide are as follows:
1$^{st}$ phase:
  O$_2$ 2200 sccm,
  SiH$_4$ 40 sccm,
  H$_2$ 1,200 sccm
  High frequency power (13.56 MHz) 0 W
  Low frequency power (250 kHz) 3,000 W
2$^{nd}$ phase:
  O$_2$ 77 sccm,
  SiH$_4$ 40 sccm,
  H$_2$ 1,200 sccm
  High frequency power (13.56 MHz) 2,450 W
  Low frequency power (250 kHz) 2,750 W
3$^{rd}$ phase:
  O$_2$ 104 sccm,
  SiH$_4$ 55 sccm,
  H$_2$ 1,200 sccm
  High frequency power (13.56 MHz) 3,000 W
  Low frequency power (250 kHz) 2,750 W Advantageously, the conditions for forming such masking layer 330 using LPCVD are as follows: Temperature 650° C., pressure 250 mTorr, TEOS rate 100 CC/minute.

Advantageously, the step of wet cleaning is executed using hydrofluoric acid of the DHF/SC1/SC2 type and comprises the following parameters:
  DHF18 SC1 SC2 on FSI
  NH4OH 170 cc/mn Hot DI Water 1,700 cc/mn 88 sec
  SC1: H2O2 200 cc/mn NH4OH 125 cc/mn Hot DI Water 1,500 cc/mn 45 sec
  NH4OH 40 cc/mn Hot DI Water 1,600 cc/mn 180 sec
  SC2: HCL 40 cc/mn H2O2=200 cc/m, Hot DI Water 1,600 cc/mn One exemplary embodiment of the present invention will now be explained in greater details while referring to the figures.

The present invention provides a method for producing PDSOI transistors and FDSOI transistors on the same SOI substrate 10. Such a substrate 10 comprises a thin surface layer made of a single-crystal semiconductor, advantageously single-crystal silicon, also called an active layer 200. Such active layer 200 is supported by an insulating layer 100. Such active layer 200 is also supported by a supporting layer, not shown.

According to one embodiment, the result of which is shown in FIG. 1, from such SOI substrate, an intermediate oxide layer 310 is formed on the whole surface of the substrate. Such intermediate oxide layer 310 preferably comprises silicon oxide.

According to one embodiment, one nitride layer 320 is deposited onto the whole intermediate oxide layer 310. Such nitride layer 320 is advantageously formed using LPCVD. According to one embodiment, the chemical composition of such nitride layer is Si3N4.

Once both layers 310 and 320 are formed, a series of steps of lithography makes it possible to form so-called STIs, the acronym for « Shallow trench isolation » 110 illustrated in FIG. 1.

Very advantageously; such STIs 110 are formed from one PECVD oxide, and preferably one PECVD silicon oxide.

Preferably, The STIs contact the BOX 100 as shown in FIG. 1.

The persons skilled in the art know several techniques for forming STIs. In the present invention. the criterion of the oxide nature is extremely important. As a matter of fact, such oxide is preferably a PECVD silicon oxide.

One process which can be considered for forming such STIs 100 is based on the utilization of conventional lithography techniques, so as to form trenches in the substrate 10. Such trenches are then filled with an oxide, advantageously one PECVD silicon oxide.

On either side of such STIs 110, regions of the active layer 200 are defined. A first active region 210 is called a PDSOI active region since it is intended to form PDSOI transistors 700. A second active region 220 is called a FDSOI active region since it is intended to form FDSOI transistors 600.

Once such regions 210 and 220 are defined by forming the STIs 110, a masking layer 330 is deposited, preferably in a compliant deposition, so as to obtain the layer 330 illustrated in FIG. 1.

Very advantageously; the masking layer 330 comprises one LPCVD oxide, and preferably one LPCVD silicon oxide. Such masking layer 330 can also be called a « hard mask D» .

Once the masking layer 330 is formed, a substrate as shown in FIG. 1 is obtained.

Figure 2:
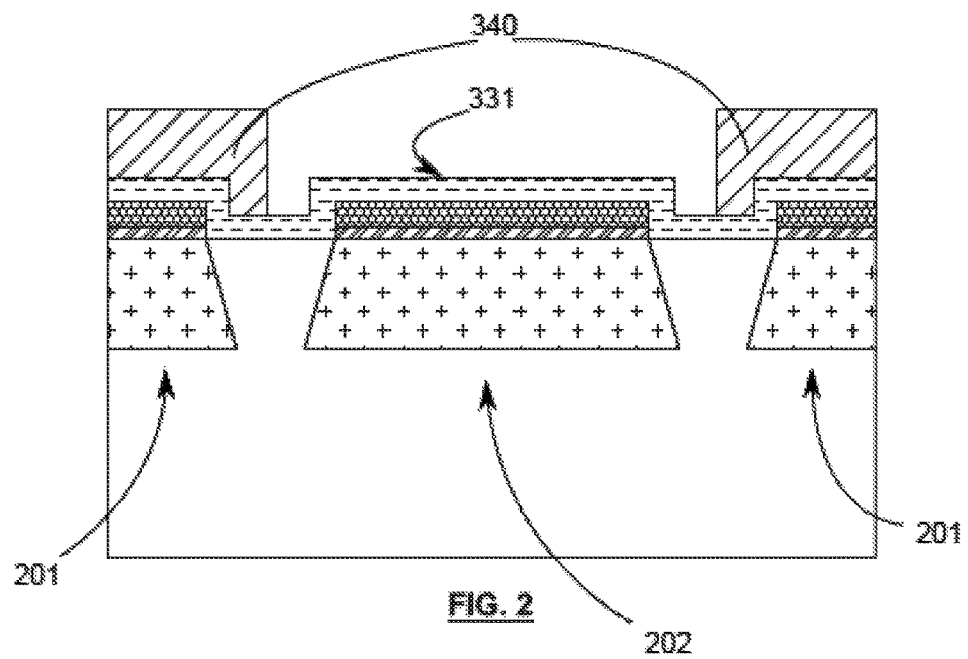
FIG. 2 shows, according to one embodiment of the present invention; a step of depositing a resin intended to mask the future PDSOI regions.

Two areas are then defined, as illustrated in FIG. 2:
  one PDSOI area 201 comprising one PDSOI active region 210, i.e. an active layer 210 intended to form at least one PDSOI transistor 700, and comprising a portion of the STIs 110 positioned on either side of the active layer 210.
  one FDSOI area 202 comprising one FDSOI active region 220, i.e. an active layer 220 intended to form at least one FDSOI transistor 600, and comprising a portion of the STIs 110 positioned on either side of the active layer 220.

FIG. 2 also shows the deposition of a protective layer 340 above the PDSOI areas. advantageously comprising resin. Such protective layer 340 is advantageously deposited onto at least one part of the surface 331 of the masking layer 330.

In a preferred embodiment, the protective layer 340 is deposited so as to cover a portion of the STIs 110, preferably about 50% of the surface thereof. It is opened using one of the numerous known lithography processes, for instance photolithography, in case of a photoresist.

Figure 3:
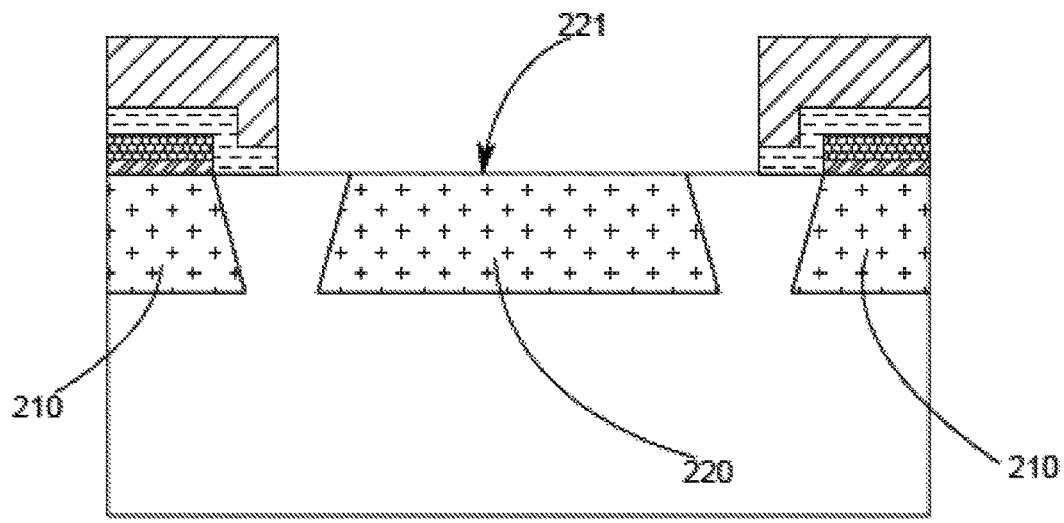
FIG. 3 shows, according to one embodiment of the present invention; the removing of said plurality of layers at the future FDSOI region.

FIG. 3 illustrates a step of etching the FDSOI areas so as to remove the masking layer 330, the nitride layer 320 and the intermediate oxide layer 310. Such step of etching is preferably chemical using fluorocarbon chemistry, for instance. Such preferably wet etching results in exposing the surface 221 of the FDSOI active region 220, as well as at least a portion of the surface of the STIs 110.

Figure 4:
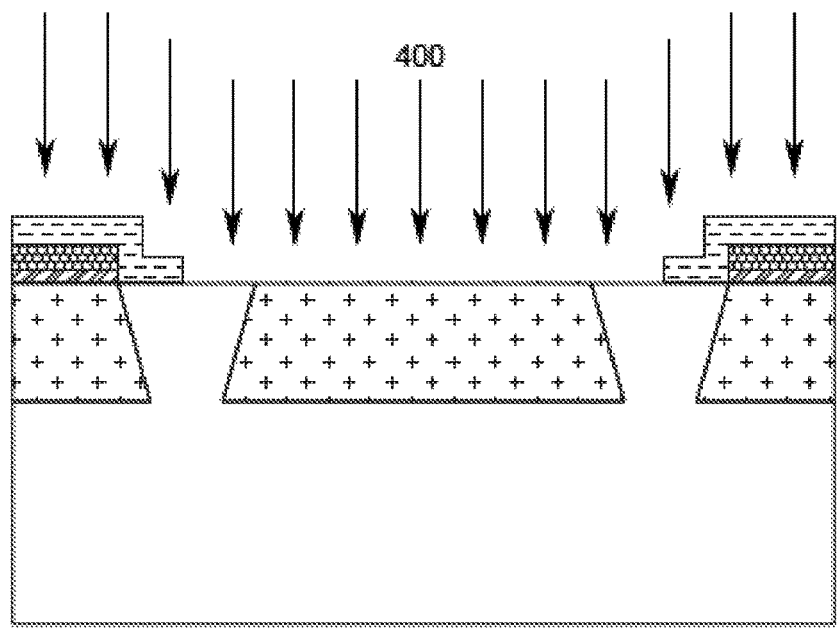
FIG. 4 shows, according to one embodiment of the present invention; a step of dry etching after removing said resin. Such step of dry etching aims, among other things, at thinning layers not covered by said masking layer.

FIG. 4 illustrates the step of dry etching 400 so configured as to thin the FDSOI area 202, and more particularly the active layer 220 and at least a portion of the STIs 110, the portion not covered with the masking layer 330.

Advantageously, the step of removing the protective layer 340 is executed prior to the step of dry etching 400. Such removal is advantageously obtained using oxygen plasma. Such removal is preferably followed by wet cleaning so as to eliminate any residue from the protective layer 340.

In addition. the native oxide present on the surface of the substrate may advantageously be cleaned using carbon tetrafluoride. Such cleaning then prepares the surfaces of the FDSOI 202 area during the step of dry etching 400.

The step of dry etching 400, using plasma, preferably high density plasma, aims at thinning the FDSOI area. Such high density plasma is advantageously based on chlorine- and oxygen-based chemistry.

According to one embodiment, dry etching 400 using high density plasma is so configured as to reach an etching rate of the order of 1 nm per second for the materials considered, and preferably for the active layer 220, advantageously made of single-crystal silicon.

Preferably, such dry etching 400 is subject to an etched thickness measure feedback loop, advantageously by interferometry. Thus etching is performed in multiple successive etching operations separated by an interferometric measurement of the consumed thickness of the materials considered and preferably of the active layer 220.

Advantageously, such dry etching 400 is so configured as to thin the active layer 220 of the FDSOI region.

Preferably, such dry etching 400 is so configured as to thin a portion of the STIs 110, i.e. a portion of the FDSOI region.

Preferably, such dry etching 400 is so configured as to totally remove the masking layer 330, advantageously from the whole substrate 10.

Very cleverly, such dry etching 400 is so configured as to simultaneously thin two materials having a different nature and remove a third material. Such dry etching 400 is configured so that the time required for totally removing the masking layer 330 corresponds to the etching time required for the desired thinning of the portions of the STIs 110 and the active layer 220.

One of the advantages of such step of dry etching 400 is the possibility of reaching an optimum thickness of the thinned active layer 220a of the order of 75 nm for forming FDSOI transistors 600.

Such step of dry etching 400 is particularly innovative since it is executed in a single step, and the active layer 220 is so thinned as to reach the desired thickness for forming the FDSOI transistors 600, the masking layer 330 is removed from the PDSOI regions and one portion of the STIs 110, surrounding the active layers 220, is also thinned.

Such step of dry etching 400 makes it possible not to use multiple chemical etching which is not economical both as regards process costs and time.

Figure 5:
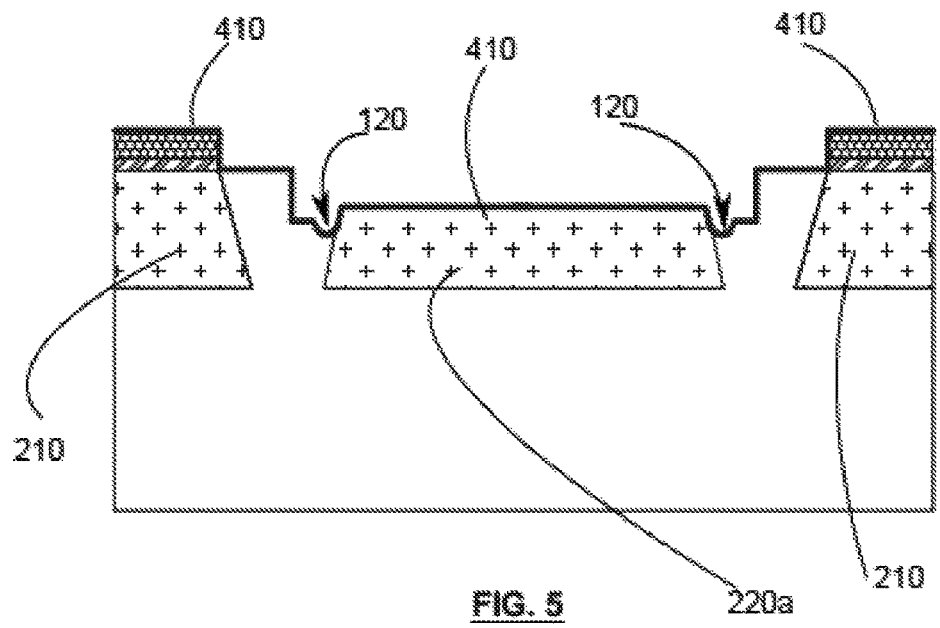
FIG. 5 shows, according to one embodiment of the present invention; the condition of the substrate after the step of dry etching with the presence of residual oxide layer and the presence of micro-trenches.

The materials used in such step of dry etching 400 have been specifically selected and formed in order to meet the conditions for the relative etching rates, in order to reach the result shown in FIG. 5.

FIG. 5 shows the result of the dry etching 400 disclosed above. The thinned active layer 220a and the etched portions of the STIs 112 have been formed at the same time as the total removal of the masking layer 330.

As a result of such dry etching 400, a residual oxide layer 410 has been formed on all the etched surfaces, for instance on the whole substrate 10. This is a residue from the step of dry etching 400.

The formation of cavities 120 can also be noted. Such cavities are called micro-trenches 120, because of their geometry, at the vertical interfaces between the active layer 220a and the etched parts of the STIs 112.

Such micro-trenching 120 is well known to the persons skilled in the art, and it is traditionally seen at the vertical interfaces between two materials having a different nature when simultaneously etching both materials. This phenomenon is one of the reasons which might turn the persons skilled in the art away from the present invention. As a matter of fact, such structural discontinuity firstly seems to be a defect affecting the performances of the FDSOI transistors 600.

However, when developing the present invention, it could rather surprisingly be noted that such structural defects 120, i.e. the micro-trenches 120, can be reduced, so that they do not affect the performances of the FDSOI transistors 600.

As a matter of fact, the shallow trenches 120 are reduced by adjusting the various chemical etching methods. The depth of the shallow trenches 120 is thus reduced in the FDSOI transistors areas and prevents, after the etching of the gate polysilicon, the presence of polysilicon filaments, which may be the source of stray connections between the different polysilicon lines of the FDSOI transistors.

As disclosed hereafter, such shallow trenches 120 are filled with polycrystalline materials during the subsequent steps of forming the FDSOI transistors 600 and mainly the gates of said FDSOI transistors 600.

Figure 6:
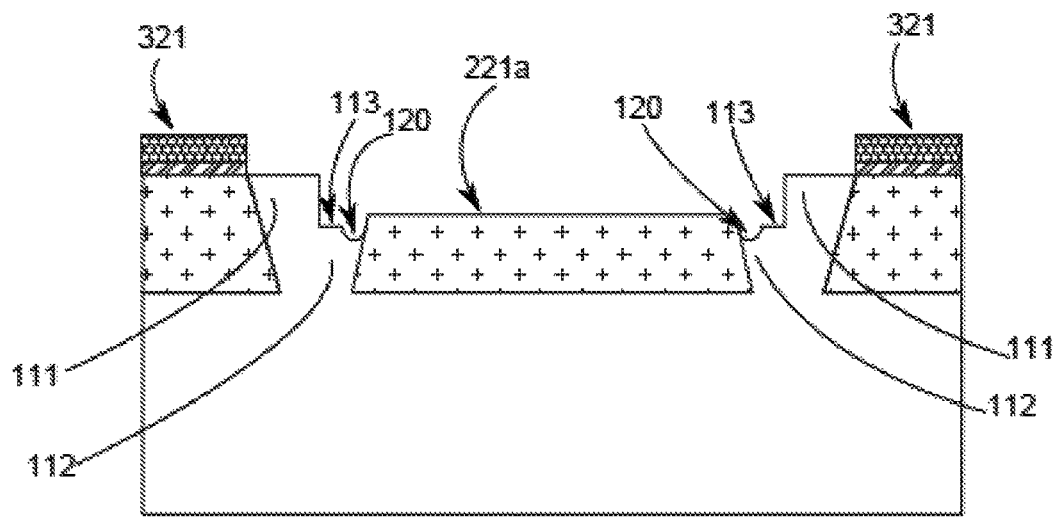
FIG. 6 shows, according to one embodiment of the present invention; a step of wet cleaning so configured as to eliminate said residual oxide layer.

A step of wet cleaning, illustrated in FIG. 6 follows the dry etching 400. Such wet cleaning is so configured as to remove the residual oxide layer 410 from all the considered surfaces.

For instance, such wet cleaning can use preferably diluted hydrofluoric acid.

Such wet cleaning is so configured as to expose at least one among the following surfaces:
the surface 321 of the nitride layer 320;
the surface 221a of the thinned active layer 220a;
the surface of the trenches 120.
the surface of the STIs 110.

Figure 7:
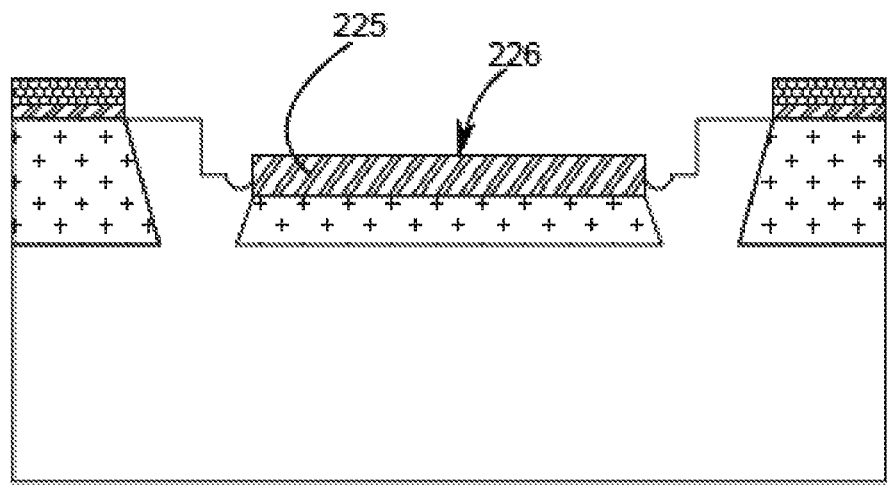
FIG. 7 shows, according to one embodiment of the present invention; a step of forming a sacrificial oxide layer at the surface of the thinned active layer.
Figure 8:
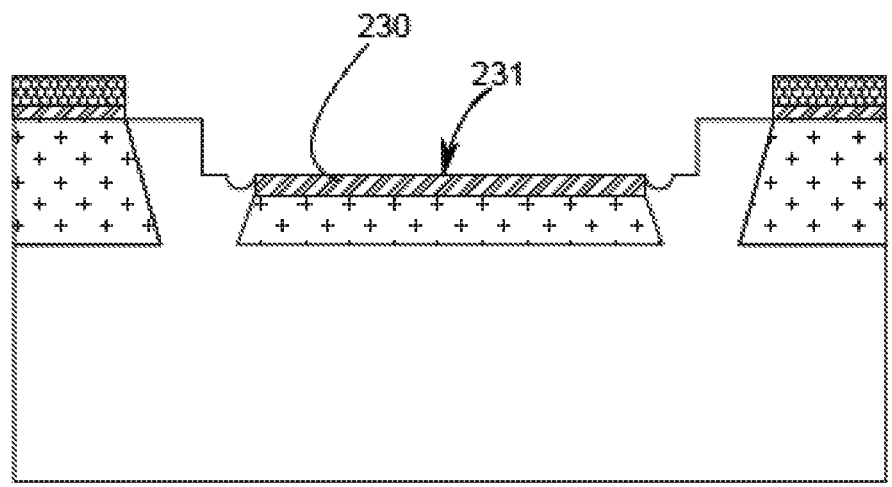
FIG. 8 shows, according to one embodiment of the present invention, a step of adjusting the height of the sacrificial oxide layer to the height of the PECVD oxide layer.

FIGS. 7 and 8 illustrate the step of adjusting the height of the surface 221a of the thinned active layer 220a to the height of the surface 113 of the etched portion of the STIs 112. Adjusting the height then makes it possible, among other things, to reduce the geometry of the shallow trenches 120, so that they do not affect the performances of the FDSOI transistors.

Advantageously, the shallow trenches 120 are reduced by adjusting the various chemical etching methods. The depth of the shallow trenches is thus reduced in the FDSOI transistors areas and prevents, after the etching of the gate polysilicon, the presence of polysilicon filaments, which may be the source of stray connections between the different polysilicon lines of the FDSOI transistors.

Such adjustment in height comprises at least two steps: forming a sacrificial oxide layer 225 and removing at least one portion of such sacrificial oxide layer 225.

The formation and the partial removing of a sacrificial oxide layer 225 act in synergy with the previous step of dry etching 400 so as to reduce the production costs of the electronic devices.

First, such sacrificial oxide layer 225 makes it possible to improve the surface condition of the thinned active layer 220a, i.e. to structurally clean the surface 221a. As a matter of fact, the surface 221a results from dry etching which may damage the surface 221a as regards crystallography on a very low thickness, of the order of a few nanometers for example. The partial removing of such sacrificial oxide layer 225 then makes it possible to remove the damaged portion of the surface 221a while leaving a residual sacrificial oxide layer 230 only, the surface 231 of which no longer shows any structural damage.

Then, the partial removing of such sacrificial oxide layer 225 makes it possible to level the surface 231 of the residual sacrificial oxide layer 230 with the height of the surfaces 113 of the etched portions of the STIs 112. Such levelling then eliminates the limiting effects of the shallow trenches 120 on the performances of the FDSOI transistors 600.

Eventually, the residual sacrificial oxide layer 230 acts as a screen to the ion implantations subsequently executed for forming the source areas 610, 710 and drain areas 620, 720. Such screen provides a better homogeneity in the implantation by preventing any channelling effect and also limiting the structural damages resulting from the ion implantations.

Thus, one single step of height adjustment makes it possible to restore a surface structure with no defects, to eliminate the drawbacks resulting from the formation of the micro-trenches 120 and to enable future ion implantations.

FIG. 9 illustrates a step of removing the nitride layer 320 at the PDSOI areas so as to expose the surface 311 of the intermediate oxide layer 310. Such removal can be a wet operation, for instance, so as not to damage the surface 231.

FIG. 10 shows the step of ion implantation 500 for forming source and drain areas.

Advantageously, such step of ion implantation 500 may comprise two sub-steps corresponding to a first ion implantation of the PDSOI areas followed by a second ion implantation of the FDSOI areas. This makes it possible to have several degrees of freedom in selecting doses and elements to be implanted in order to meet the various requirements as regards the characteristics of the PDSOI 700 and FDSOI transistors 600.

Such step of ion implantation 500 advantageously benefits from the presence of the intermediate oxide layer 310 the PDSOI areas and the residual sacrificial oxide layer 231 at the FDSOI areas so as to ensure a very homogeneous implantation and to limit the structural defects in the ion implantation. The intermediate oxide layers 310 at the PDSOI areas and the residual sacrificial oxide layer 231 at the FDSOI areas then act as screens to optimise the formation of the sources and the drains.

FIG. 11 shows, according to a preferred embodiment, a FDSOI 600 transistor formed above the thinned FDSOI active region 220a and two PDSOI transistors 700, shown in halves in FIG. 11, and formed above the PDSOI 210 active regions.

In FIG. 11 each transistor is schematically shown. Each transistor comprises at least one source area (610, 710) and one drain area (620, 720), raised in this example, with a gate (630, 730) preferably comprising a plurality of layers and potentially spacers electrically insulating the sides of each gate (630, 730) of the source (610, 710) and drain areas (620, 720).

FIG. 11 shows the position of the PDSOI transistors 700 and the FDSOI transistors 600 relative to the PDSOI 201 areas and to the FDSOI 202 areas, according to one embodiment of the present invention.

The present invention relates to a method for producing an electronic device adapted to form PDSOI and FDSOI transistors on the same silicon wafer. The present invention comprises steps which have been studied, developed and optimized so as to have a mutual synergy so as to reduce production costs for such a device while not affecting the performances of electronic devices of this type.

Thus, some pluralities have multiple effects for reducing the total number of required steps.

The invention is not limited to the embodiments described above but applies to all the embodiments covered by the scope of the claims.

REFERENCES

10. Stack of layers, SOI substrate
100. Insulating layer, BOX, silicon oxide

110. Shallow Trench Isolation or STI
111. Part of the shallow trenches covered with the masking layer
112. Etched part of the shallow trenches
113. Surface of the etched part of the shallow trenches
120. Cavities, Micro-trenches
200. Active layer;
201. PDSOI area
202. FDSOI area
210. First active region, PDSOI active region, active layer
220. Second active region, FDSOI active region, active layer
220a. Second thinned active region, thinned FDSOI active region, thinned active layer
221. Surface of the second active region
221a. Surface of the second thinned active region
225. Sacrificial oxide layer
226. Surface of the sacrificial oxide layer
230. Residual sacrificial oxide layer
231. Surface of the residual sacrificial oxide layer
310. Intermediate oxide layer
311. Surface of the intermediate oxide layer
320. Nitride layer
321. Surface of the nitride layer
330. Masking layer
331. Surface of the masking layer
340. Protective layer, resin
400. Dry etching;
500. Ion implantation;
600. Fully depleted transistor FDSOI transistor
610. Source area
620. Drain area
630. Gate
700. Partially depleted transistor PDSOI transistor
710. Source area
720. Drain area
730. Gate

The invention claimed is:

1. A method for forming an electronic device intended to accommodate at least one fully depleted transistor (FDSOI) and at least one partially depleted transistor (PDSOI), from a stack of layers comprising at least one insulating layer topped with at least one active layer made of a semiconductor material, with the method comprising at least the following steps:
forming at least one shallow trench through the thickness of the active layer so as to define, in said active layer, on either side of the shallow trench, at least one first active region whereon at least one PDSOI transistor is intended to be formed and at least one second active region whereon at least one FDSOI transistor is intended to be formed;
forming, above the at least one first active region and on a part of the shallow trench, a masking layer, without covering the at least one second active region and without covering a part of the shallow trench;
simultaneously etching, using dry etching, so as to form etched areas:
a part of the thickness of the active layer of the at least one second active region so as to form at least one second thinned active region and to obtain, in the at least one second thinned active region a thickness of the active layer smaller than in the at least one first active region,
at least a part of the thickness of the not covered part of the shallow trench so as to form an etched part of the shallow trench, and
the whole masking layer, and
adjusting, after the step of dry etching, the height of the surface of the at least one second thinned active region to the height of the surface of said one etched part of the shallow trench the step of adjusting the height of the surface of the at least one second thinned active region to the height of the surface of said etched part of the shallow trench comprises at least the following steps:
oxidation of at least one portion of the second thinned active region so as to form a sacrificial oxide layer; and
partial removal of the sacrificial oxide layer so as to form a residual sacrificial oxide layer and so that the surface of the residual sacrificial oxide layer is at the same height as the surface of the etched part of the shallow trench.

2. The method according to claim 1, wherein the shallow trench comprises at least one oxide formed by plasma-enhanced chemical vapor deposition.

3. The method according to claim 1, wherein the shallow trench comprises at least one oxide formed by plasma-enhanced chemical vapor deposition, wherein the masking layer comprises at least one oxide formed by sub-atmospheric chemical vapor phase deposition, and wherein the dry etching the at least one oxide formed by plasma-enhanced chemical vapor phase deposition and the at least one oxide formed by sub-atmospheric chemical vapor phase deposition are so configured that the time required for forming the at least one etched part of the shallow trench corresponds to the time required for etching the whole thickness of the masking layer.

4. The method according to claim 1, wherein the masking layer comprises at least one oxide formed by sub-atmospheric chemical vapor phase deposition.

5. The method according to claim 1, wherein the sacrificial oxide layer is formed by a step of oxidation on at least a part of the thickness of the at least one second thinned active region.

6. The method according to claim 1, wherein the sacrificial oxide layer has a thickness preferably ranging from 6 nm to 8 nm, and advantageously equal to 5 nm.

7. The method according to claim 1, wherein the dry etching is a plasma etching.

8. The method according to claim 7, wherein the plasma is a high density plasma.

9. The method according to claim 1, wherein the active layer has an initial thickness ranging from 100 nm to 200 nm, and wherein the at least one first active region has a thickness ranging from 100 nm to 200 nm, and wherein the at least one second thinned active region has a thickness ranging from 25 nm to 100 nm.

10. The method according to claim 1, wherein the step of dry etching is followed by a step of wet cleaning the surfaces of said etched areas.

11. The method according to claim 10, wherein the step of wet cleaning the surface of said etched areas is so configured as to eliminate residual materials resulting from the step of dry etching.

12. The method according to claim 1, wherein the shallow trench contacts the insulating layer.

13. The method according to claim 1, wherein the step of forming the masking layer above the at least one first active region and on at least a part of the shallow trench follows the forming of an intermediate oxide layer on said at least one first active region.

14. The method according to claim 13, wherein the step of forming the intermediate oxide layer on the at least one first active region is followed by the forming of a nitride layer above the intermediate oxide layer, so that the masking layer at least partially contacts said nitride layer.

15. The method according to claim 1, wherein the active layer has an initial thickness ranging from 125 nm to 180 nm and wherein the at least one first active region has a thickness ranging from 125 nm to 180 nm, and wherein the at least one second thinned active region has a thickness ranging from 50 nm to 85 nm.

16. The method according to claim 1, wherein the active layer has an initial thickness equal to 140 nm, and wherein the at least one first active region has a thickness equal to 140 nm, and wherein the at least one second thinned active region has a thickness equal to 70 nm.

17. A method for forming an electronic device intended to accommodate at least one fully depleted transistor (FDSOI) and at least one partially depleted transistor (PDSOI), from a stack of layers comprising at least one insulating layer topped with at least one active layer made of a semiconductor material, with the method comprising at least the following steps:
   forming at least one shallow trench through the thickness of the active layer so as to define, in said active layer, on either side of the shallow trench, at least one first active region whereon at least one PDSOI transistor is intended to be formed and at least one second active region whereon at least one FDSOI transistor is intended to be formed;
   simultaneously etching, using dry etching, so as to form etched areas:
      a part of the thickness of the active layer of the at least one second active region so as to form at least one second thinned active region and to obtain, in the at least one second thinned active region a thickness of the active layer smaller than in the at least one first active region, and
      at least a part of the thickness of a part of the shallow trench so as to form an etched part of the shallow trench, and
   adjusting, after the step of dry etching, the height of the surface of the at least one second thinned active region to the height of the surface of said one etched part of the shallow trench, the step of adjusting the height of the surface of the at least one second thinned active region to the height of the surface of said etched part of the shallow trench comprises at least the following steps:
      oxidation of at least one portion of the second thinned active region so as to form a sacrificial oxide layer; and
      partial removal of the sacrificial oxide layer so as to form a residual sacrificial oxide layer and so that the surface of the residual sacrificial oxide layer is at the same height as the surface of the etched part of the shallow trench.

* * * * *